(12) United States Patent
Anderson et al.

(10) Patent No.: US 9,373,554 B2
(45) Date of Patent: Jun. 21, 2016

(54) ORGANIC LIGHT EMITTING DIODE FABRICATION WITH HOLE TRANSPORT/INJECTION LAYER THICKNESS MEASUREMENT

(71) Applicant: CAMBRIDGE DISPLAY TECHNOLOGY LIMITED, Cambridgeshire (GB)

(72) Inventors: Graham Anderson, Cambridge (GB); Michael Cass, Cambridge (GB); Daniel Forsythe, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/315,155

(22) Filed: Jun. 25, 2014

(65) Prior Publication Data
US 2015/0031147 A1  Jan. 29, 2015

(30) Foreign Application Priority Data
Jun. 25, 2013 (GB) .................................. 1311268.5

(51) Int. Cl.
*H01L 21/66* (2006.01)
*H01L 51/56* (2006.01)
*H01L 27/32* (2006.01)

(52) U.S. Cl.
CPC ............... *H01L 22/26* (2013.01); *H01L 22/12* (2013.01); *H01L 27/3211* (2013.01); *H01L 51/56* (2013.01); *H01L 2251/558* (2013.01)

(58) Field of Classification Search
CPC ..... H01L 22/26; H01L 27/3211; H01L 51/56; H01L 22/12; H01L 2251/558
USPC .................................................. 438/5; 345/32
See application file for complete search history.

(56) References Cited

U.S. PATENT DOCUMENTS

| 4,539,570 A | 9/1985 | Moore | |
| 2005/0227385 A1* | 10/2005 | Tan | ..................... H01L 27/3293 438/15 |

(Continued)

FOREIGN PATENT DOCUMENTS

| KP | 10-2011-0059167 | 6/2011 |
| WO | WO-90/13148 A1 | 11/1990 |
| WO | WO-95/06400 A1 | 3/1995 |
| WO | WO-99/48160 A1 | 9/1999 |
| WO | WO-00/76010 A1 | 12/2000 |

OTHER PUBLICATIONS

Chin, "Effective Hold Transport Layer Structure for Top-Emitting Organic Light Emitting Devices Based on Laser Transfer Patterning," *J. Phys. D. Appl. Phys.*, 40:5541-5546 (2007).

(Continued)

*Primary Examiner* — John P Dulka
(74) *Attorney, Agent, or Firm* — Marshall, Gerstein & Borun LLP (57) ABSTRACT

A method of monitoring an OLED production process for making an OLED device is disclosed. According to the method, at least one reference OLED device similar to said OLED device is fabricated. Said at least one reference OLED device has a layered structure corresponding to said OLED device and a range of hole injection and/or transport layer thicknesses. A spectral variation of a light output of said at least one reference OLED device with respect to variation in said hole injection and/or transport layer thickness is characterized. A said OLED device is partially fabricated by depositing one or more layers comprising at least said hole injection and/or transport layer and a thickness of said one or more layers is measured such that a light output for said partially fabricated OLED device can be predicted, in a target color space, from said measuring, using said characterized spectral variation.

18 Claims, 5 Drawing Sheets

(56) References Cited

U.S. PATENT DOCUMENTS

2007/0286944 A1    12/2007  Yokoyama et al.
2009/0170230 A1*    7/2009  Kidu .................. H01L 27/3211
                                                           438/35
2012/0313513 A1*   12/2012  Tanaka .................. C08F 26/12
                                                           313/504

OTHER PUBLICATIONS

Han et al., "Color Tunable Metal-Cavity Organic Light-Emitting Diodes with Fullerene Layer," *J. Appl. Phys.*, 97:093102 (2005).

Li et al., "Effects of Hole Injection Layer Thickness of the Luminescent Properties of White Organic Light-Emitting Diodes," *Appl. Surf. Sci.*, 253:2522-2524 (2006).

Li et al., Organic Light Emitting Materials and Devices, CRC Press (2007). Table of Contents only.

Redecker et al., "High Mobility Hole Transport Fluorene-Triarylamine Copolymers," *Adv. Mater.*, 11(3):241-246 (1999).

Zhang et al., "Colour Tunability of Blue Top-Emitting Organic Light-Emitting Devices with Single-Mode Resonance and Improved Performance by Using $C_{60}$ Capping Layer and Dual Emission Layer," *J. Phys. D. Appl. Phys.*, 42(14):145106 (2009).

Combined Search and Examination Report for Application No. GB1311268.5, dated Nov. 15, 2013.

* cited by examiner

ORGANIC LIGHT EMITTING DIODE FABRICATION WITH HOLE TRANSPORT/INJECTION LAYER THICKNESS MEASUREMENT

FIELD OF THE INVENTION

This invention relates to improved techniques for the fabrication of organic light emitting diode (OLED) devices especially, though not limited to, polymer OLED devices, and to devices manufactured by these techniques.

BACKGROUND TO THE INVENTION

Figure 1A:
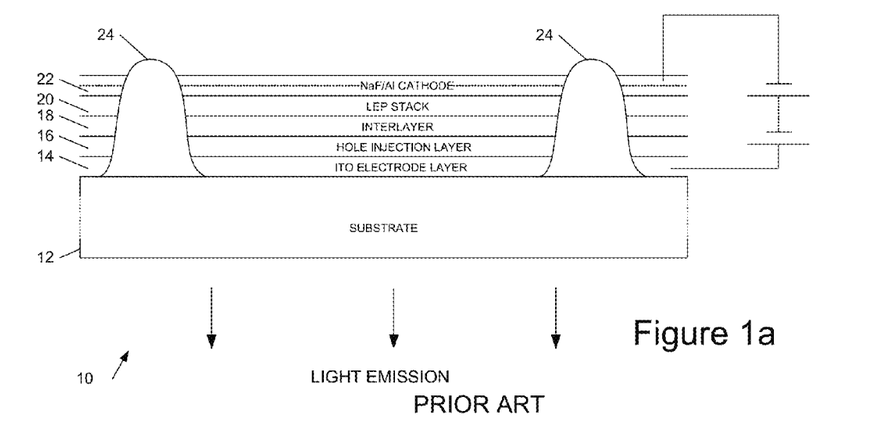
FIGS. 1a and 1b show respectively, a cross section through an example bottom-emitter OLED device structure, and a view from above of a portion of a 3-colour pixelated OLED display.

FIG. 1a shows a cross section through a typical pixelated OLED display device 10. This comprises a substrate 12 bearing a transparent conductive oxide layer 14, typically ITO (Indium Tin Oxide), which may be patterned, typically around 40 nm in thickness. Over this is deposited a hole injection layer (HIL) 16 typically comprising a conducting polymer such as PSS:PEDOT (polystyrene-sulphonate-doped polyethylene-dioxythiophene). This helps match the hole energy levels of the ITO anode and light emitting polymer (and can also assist in planarising the ITO), and is typically around 30 nm in thickness though potentially up to around 150 nm. A similar layer is generally present in an organic photovoltaic device to facilitate the extraction of holes. Commercial hole injection materials are available, inter alia, from Plextronics Inc.

The hole injection layer is, in this example, followed by an intermediate polymer layer, interlayer (IL) 18—also known as a hole transport layer (HTL). This is made of a hole transport material which allows efficient transport of holes; it typically has a thickness in the range 20 nm to 60 nm and is deposited over the hole injection layer and, generally, is cross-linked so that it is insoluble in the solvent used to deposit the subsequent layer. One example material from which the interlayer may be fabricated is a co-polymer of polyfluorene-triarylamine or similar (examples of other suitable materials are described by Bradley et al. in Adv. Mater. vol 11, p241-246 (1999) and in Chapter 2 of Li and Meng—see below).

Over this is deposited one or more layers of light emitting polymer (LEP) 20 to form an LEP layer or stack; a typical example of a light emitting polymer is PPV (Poly(p-phenylenevinylene)). A cathode 22 is deposited over the LEP stack, for example comprising a layer of sodium fluoride (NaF) followed by a layer of aluminium. Optionally an additional electron transport layer may be deposited between the LEP stack 20 and cathode 22.

It can be advantageous to arrange for the electrodes and the layers between to define a resonant cavity as described, for example, in WO00/76010. Such an arrangement can improve the efficiency of operation of the device and increase the colour gamut available.

The device illustrated in FIG. 1a is a bottom-emitting device, that is light generated in the LEP stack is coupled out of the device through the substrate, via the transparent ITO anode layer (in an active matrix display a thin film transistor (TF) may be located in one corner of the pixel). It is also possible to fabricate top-emitting devices using a thin cathode layer (in which case a thick metal anode may be employed), for example a layer of ITO or zinc oxide less than around 100 nm in thickness. Although the structure of FIG. 1a shows an LEP stack the same basic structure may also be employed for small molecule (and dendrimer) devices.

The materials to fabricate an OLED or other organic electronic device may be deposited by ink jet printing (IJP). As illustrated, for this type of pixelated device the materials may be deposited in solution from an ink jet print head into regions defined by banks 24 (or, equivalently, wells).

The skilled person will appreciate that there are many variants of an organic electronic device fabrication process in the context of which the techniques we have described may be employed. For example, the ITO layer may be omitted and instead the hole injection layer 16 used as the anode layer. Additionally or alternatively the electrical conductivity of the hole injection layer 16 may be supported by an underlying metallic grid (which may optionally be transparent by using fine grid lines and/or thin metal). Such an approach may be employed, for example, in an OLED lighting tile with a large area of coverage and connections at the edge. In the case of a lighting tile, generally large-area deposition techniques such as evaporation are employed in preference to ink jet deposition and the pixel-defining banks/wells are absent. Optionally a flexible substrate such as PET (polyethylene terephthalate) or polycarbonate may be employed.

Figure 1B:
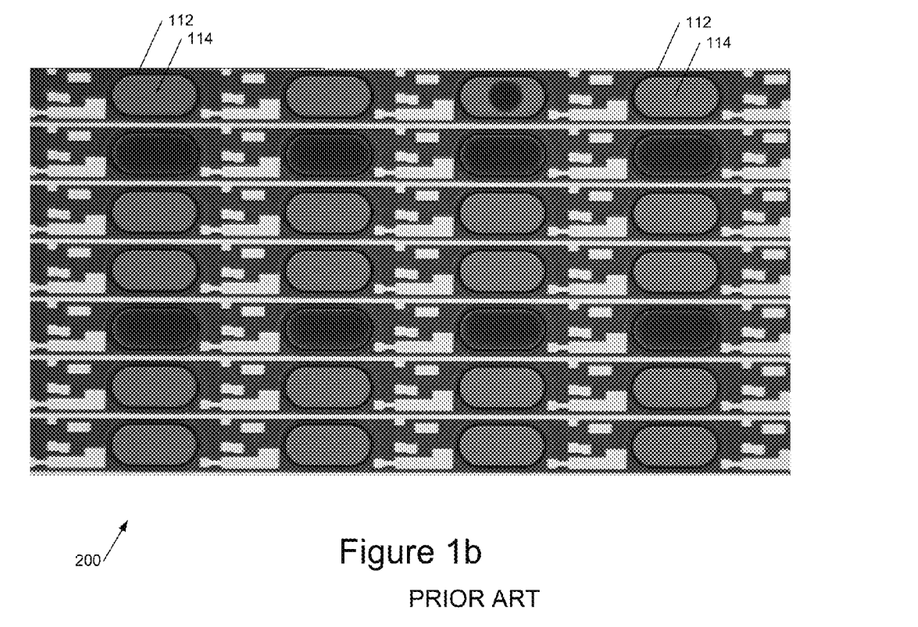

FIG. 1b shows a view from above of a portion of an example three-colour active matrix pixelated OLED display 200 after deposition of one of the active colour layers. The figure shows an array of banks 112 and wells 114 defining pixels of the display. In a colour display different coloured (sub)pixels may comprise respectively green, red and blue light emitting polymer layers.

Organic electronic devices provide many potential advantages including inexpensive, low temperature, large scale fabrication on a variety of substrates including glass and plastic. Organic light emitting diode displays provide additional advantages as compared with other display technologies—in particular they are bright, colourful, fast-switching and provide a wide viewing angle. OLED devices (which here includes organometallic devices and devices including one or more phosphors) may be fabricated using either polymers or small molecules in a range of colours and in multicoloured displays depending upon the materials used. For general background information reference may be made, for example, to WO90/13148, WO95/06400, WO99/48160 and U.S. Pat. No. 4,539,570, as well as to "Organic Light Emitting Materials and Devices" edited by Zhigang Li and Hong Meng, CRC Press (2007), ISBN 10: 1-57444-574X, which describes a number of materials and devices, both small molecule and polymer. (Here "small molecule" refers to non-polymeric small molecules—some so-called small molecules such as dendrimers end may be relatively large, but nonetheless have the characterizing feature that they do not comprise multiple repeat units assembled by polymerization).

Despite the aforementioned advantages of OLEDs there are some problems in efficiently manufacturing OLEDs in a production process. This is because, in general, there is a desire to achieve repeatable performance to relatively tight tolerance limits, in part driven by the human eye's colour and luminance sensitivity. The performance of an OLED can be modelled theoretically but in practice there are many parameters in such models which are not well known and underlying assumptions which mean that this approach is not reliable. On the other hand, repeatedly adjusting the parameters of a production process until devices with the required characteristics are produced is slow and expensive (since many substrates are discarded). There is therefore a need for improved techniques.

SUMMARY OF THE INVENTION

According to the present invention there is therefore provided a method of monitoring an OLED production process for making a production process OLED device, the production process OLED device having a layered structure comprising an anode layer and a cathode layer, said anode and cathode layers sandwiching a hole injection layer, a hole transport layer and at least one organic light emitting layer, the method comprising: fabricating at least one similar OLED device to said production process OLED device, wherein said at least one similar OLED device has a layered structure corresponding to said production process OLED device and a range of hole injection and/or transport layer thicknesses; characterising a spectral variation of a light output of said at least one similar OLED device with respect to variation in said hole injection and/or transport layer thickness; partially fabricating a said production process OLED device using said production process, wherein said partial fabrication comprises depositing one or more layers comprising at least said hole injection and/or transport layer; measuring a thickness of said one or more layers comprising at least said hole injection and/or transport layer; predicting a light output for said partially fabricated production process OLED device, in a target colour space, from said measuring, using said characterised spectral variation; and monitoring said production process using said predicted light output.

The colour of the light output from an OLED device is a function particularly of the thickness of the hole injection and/or transport layers—the hole injection layer is especially important but in general the refractive index of the hole transport layer or interlayer is close to that of the hole injection layer and thus these two layers may be considered together. Preferred OLED devices have a layered structure which defines a resonant cavity at the wavelength of the operation of the device. In such a device broadly speaking the optical path length between the reflecting/semi-reflecting surfaces, including phase shifts on the reflection at these surfaces, is an integral multiple of half the wavelength of operation. In practice the situation can be more complicated because the light-emitting region is distributed over a thickness range and is not in the middle of the cavity. Nonetheless variation in the thicknesses of the various layers results in a change in efficiency of operation of the device, a change in out-coupling efficiency and also, by affecting the tuning of the cavity, a colour change.

In embodiments of the method, rather than fabricating a complete device a partial device is fabricated on the same substrate as used for the actual, production device up to the level of the hole injection layer and/or transport layer (interlayer), and this is used to predict the light output, more particularly the colour of light, were the process to be continued to fabricate the complete production process OLED device. This saves both time and money and, in principle, the partially fabricated substrates may be re-used after cleaning.

In some preferred applications the method is applied to pixels of a pixelated OLED display device. Contrary to what one might expect from theoretical predictions, this approach also works where there is a significant range of thicknesses of the hole injection and/or transport layer over the area of the partially fabricated device. This can occur when a pixelated device is inkjet printed, for example due to edge effects, but can also occur over the area of a large area device such as a lighting tile where material is deposited by, say, evaporation. Thus the techniques we describe also facilitate using a process which may intrinsically provide a relatively wide range of thickness variation within a single device.

In some embodiments of the method the light output prediction established from the partially fabricated device may be employed simply to determine whether, where the substrates to be completed, the device would pass/fail target light output criteria for the device. However the method may also be employed to adjust, and optimise, the thickness of layers of the device, in particular the hole injection layer (HIL) and/or hole transport layer HTL (i.e. interlayer, IL). This can be used to adapt the light output to one or more target criteria, for example to achieve a target colour point (hue/intensity) and/or optimise efficiency of the device. Devices may then be fabricated using the thickness(es) established by the method. Additionally or alternatively, embodiments of the method may be employed to screen HIL and/or HTL materials, for example to select an HIL and/or HTL material for use in a device.

In embodiments of the method a device calibration curve is established for a nominal, target set of layer thicknesses for the device—that is, for a particular electrode thickness, light emitting layer thickness and so forth. A particular device could, for example, be a 'type 23 device' with a particular target CIE value, and this would have nominal thicknesses for the hole injection layer and/or hole transport layer. To determine the calibration curve a set of test cells may be fabricated with known regions in which the layer thicknesses, in particular of the HIL/HTL layers, are substantially constant (flat) and the light output from these regions of different thickness may then be used to determine a calibration curve. Alternatively where, as in a pixel of a display, the thickness of the HIL layer varies significantly over the pixel, the light output from different regions within a pixel may be characterised to obtain data for different thicknesses of the HIL/HTL layer(s) (which may be measured in a separate step, for example by white light interferometry). Thus in one approach a calibration curve is constructed by partially fabricating one or more OLED devices, measuring at least a thickness of the HIL and/or hole transport layer (HTL), completing fabrication of the device(s), and then measuring the light output of the device(s) for various thicknesses of the HIL/HTL layers to construct a calibration curve of device colour and/or efficiency (which are, in general, not independent of one another). In general such a calibration procedure is performed for a particular thickness of the electrode (anode/cathode) layer(s) and of the light emitting material which corresponds to a thickness to be used in the actual device; or a set of electrode/LEP (light emitting polymer) thicknesses may be employed.

In embodiments the characterisation of the spectral variation of the light output (from a calibration OLED device) is performed by determining a set of tristimulus values for the light output, for example by using a set of three different filters or by collecting a spectrum of the light and applying corresponding mathematical filters to determine X, Y and Z tristimulus values. In principle the spectral characterisation and light output prediction may be performed in the same colour space, either X, Y, Z or, for example, CIE xyY. However in preferred embodiments the tristimulus values are converted into CIE (International Commission on Illumination) colour space, such as CIE 1931 xyY colour space (though in principle other colour spaces such as CIE 1960, CIE 1964 or CIE 1976 may also be employed). CIE xyY is particularly useful for OLED devices as the CIEy parameter is very sensitive to blue, which can be a 'difficult' colour for OLEDs.

In principle a calibration curve may be converted to the target colour space and used to make a direct prediction of the light output based on thickness—that is the spectral characterisation may be used to define a colour variation of the light output in the target colour space with respect to hole injection and/or transport layer thickness. In some preferred embodiments, however, the predicted light output is defined by a calibration curve in terms of a set of tristimulus values for a hole injection and/or transport layer (HIL/HTL) thickness. Then, for an OLED device with a varying hole injection and/or transport layer thickness, a light output prediction for the device may be made by summing the predicted light output from each of a set of locations and converting the summed light output into the target colour space, for example CIE xyY.

Thus optionally an average colour for a pixel or region of an OLED device may be determined by meshing the pixel or region and determining the average colour (CIE value) over the meshed area. This is particularly useful where there is a range of HIL/HTL layer thicknesses over a pixel/device, for example due to edge effects, pinning and the like when inkjet printing a pixel: It is not necessary to constrain the thickness to a single value if the colour can be accurately predicted even when a range of thicknesses of the hole injection and/or transport layers exists.

Although embodiments of the method have been described with reference to one pixel of a single nominal colour, it will be appreciated that the technique may be extended to a pixelated display with pixels of different colours, for example red, green and blue. In this case there will in general be some common layer thicknesses between the pixels, at least the thicknesses of the electrode layers. Because of the thickness variation of, in particular, the hole injection layer across a pixel, in principle one pixel of each colour may be sufficient to determine the calibration curve for a production process for an entire panel. More often however, a calibration curve for a device will be determined from a (small) number of pixels with the hole injection layer and/or interlayer in each pixel deposited using a different number of droplets of material in solution, to obtain a set of overlapping ranges of hole injection layer/hole transport layer thicknesses (where the range of thicknesses is present over an area of a pixel).

Use of the above described techniques has identified a new set of optimum layer thicknesses and, in particular, has indicated that for a blue OLED device (for example an emission wavelength in the range 380 nm to 490 nm), a change to a thick ITO (Indium Tin Oxide) anode from a thin ITO/thick HIL structure is advantageous.

Thus in a further aspect the invention provides a production process OLED device, the production process OLED device having a layered structure comprising an anode layer and a cathode layer, said anode and cathode layers sandwiching a hole injection layer, a hole transport layer and at least one organic light emitting layer, wherein said anode layer has a thickness of greater than 50 nm, wherein said hole injection layer has a thickness of less than 50 nm, and wherein said OLED device has a blue light emission in the range 380 nm to 490 nm.

Although we have described embodiments of the method with particular reference to a pixel of a multi-pixel OLED display device the techniques are also applicable where the OLED device is a large area device such as a lighting tile. Then embodiments of the method may be used either to predict a variation in colour of light output with lateral position on the tile or to predict the average colour of the overall light output from the tile. Where the hole injection layer is deposited by, say, evaporation it may exhibit a substantially uniform thickness across the area of the device but one or more of the other layers, for example the hole transport layer (interlayer) may have a varying thickness. But more generally in principle any of the layers may have a varying thickness. In particular in a resonant cavity type device structure, this may influence one or both of the overall light output and the colour of the light output.

Thus in a related aspect the invention provides a method of monitoring an OLED production process for making a production process OLED device, the production process OLED device having a layered structure comprising an anode layer and a cathode layer, said anode and cathode layers sandwiching a hole injection layer, a hole transport layer and at least one organic light emitting layer, the method comprising: fabricating at least one similar OLED device to said production process OLED device, wherein said at least one similar OLED device has a layered structure corresponding to said production process OLED device and a range of thicknesses of at least one test layer of said production process OLED device; characterising a variation of light output from said at least one similar OLED device with respect to variation in said test layer thickness; partially fabricating a said production process OLED device using said production process, wherein said partial fabrication comprises depositing one or more layers comprising at least said test layer; measuring a thickness of said one or more layers comprising at least said test layer; predicting a light output for said partially fabricated production process OLED device from said characterising; and monitoring said production process using said predicted light output.

The skilled person will appreciate that the above described techniques are applicable not only to polymer OLED devices, but also to small molecule devices.

BRIEF DESCRIPTION OF THE DRAWINGS

These and other aspects of the invention will now be further described, by way of example only, with reference to the accompanying figures, in which.

DETAILED DESCRIPTION OF PREFERRED EMBODIMENTS

The efficiency of a resonant microcavity inkjet printed OLED device depends strongly on the thickness, more particularly on the distribution of thicknesses, of the solution processed hole injection layer (HIL) and of the interlayer (IL) sometimes called the hole transport layer (HTL). The colour of an OLED device with a resonant cavity is dependent on the variation of efficiency with wavelength and thus the colour point also depends on the thickness distributions of these layers.

We will describe techniques which are able to accurately predict the output of a microcavity inkjet printed panel based on the HIL thickness profile before the light emitting polymer (LEP) and cathode layers are deposited. The thickness may be measured by interferometry, for example using a white light interferometer such as the Zygo New View 5000 series instrument. This approach greatly speeds up the screening of HIL materials and can also provide in-line pass/fail categorisation of an HIL profile, for example to predict for the thickness profile of a deposited HIL layer whether or not, for example, blue emitted light from the device is within colour (intensity and hue) tolerance. More generally, the techniques we describe are able to be used to predict/optimise one or more parameters of an HIL fabrication process including but not limited to, one or more of: a number of droplets used to deposit HIL material in solution into a region/well, a droplet size/volume, and HIL layer drying protocol (such as drying duration, whether one or multiple passes are used to deposit material, maximum time between passes and so forth).

This can be done without fabricating a test cell or device with the thickness profile, saving both time and cost in achieving a profile needed to hit a sRGB colour point. A 'stop/go' determination may be made after deposition of the first printed layer (the HIL layer) rather than after three printed layers and evaporation of a cathode layer. In addition, in principle an expensive substrate, bearing TFTs and a pixel wall-structure, may also be re-worked by dissolving off the HIL.

A previous optimisation procedure for the layer thicknesses had identified a thin ITO (<10 nm) and thick HIL (>100 nm) structure as being advantageous but embodiments of the new techniques identified this as a local maximum and enabled a switch to thick ITO (>50 nm) thin HIL (<50 nm) structures for improved performance.

Figure 2:
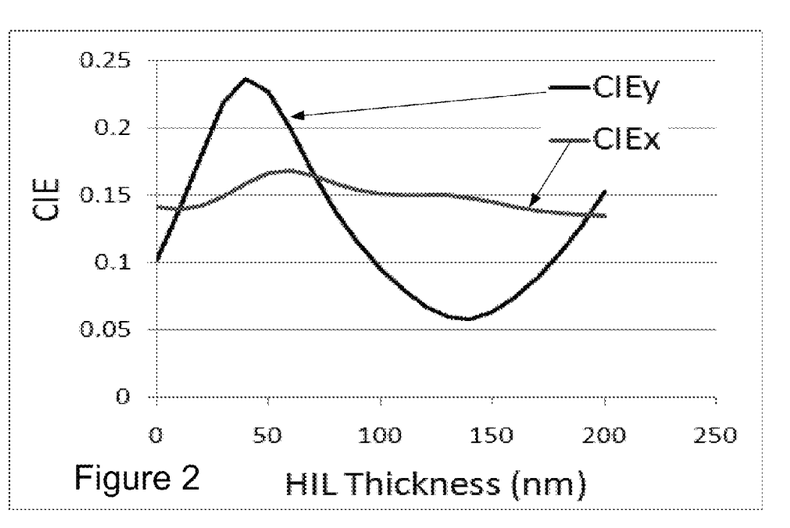
FIG. 2 shows a theoretical prediction of variation in OLED colour with hole injection layer thickness.

Referring to FIG. 2, this shows CIEx and CIEy parameters from a theoretical model of a blue microcavity OLED device with the following structure (where thicknesses are shown parenthetically in nanometers):

glass/ITO (7.5)/Ag(15)/ITO(7.5)/HIL(x)/IL(22)/LEP(70)/cathode where x is the HIL layer thickness.

The variation shown in FIG. 2 is for a simple dipole emitter model, assumes optically flat films, and requires precise input of many parameters such as refractive index and dielectric constant that may not be accurately known and/or may require a time-consuming characterisation study. This approach is therefore impractical for accurately predicting the output of microcavity inkjet printed devices. Further, as described below, the HIL layer thickness can vary by up to +/−50% across a colour (sub-)pixel in a complex manner.

Another approach which may be employed is to fabricate a series of OLED devices in which the layers are deposited by spin coating/casting so that the edge effects, pinning and the like in display pixels are avoided. Such an approach enables the thicknesses of the layers to be well defined, for example to approximately +/−2 nm, and FIG. 3 shows measured variation of the CIEx and CIEy parameters for the same OLED structure as for FIG. 2.

Figure 3:
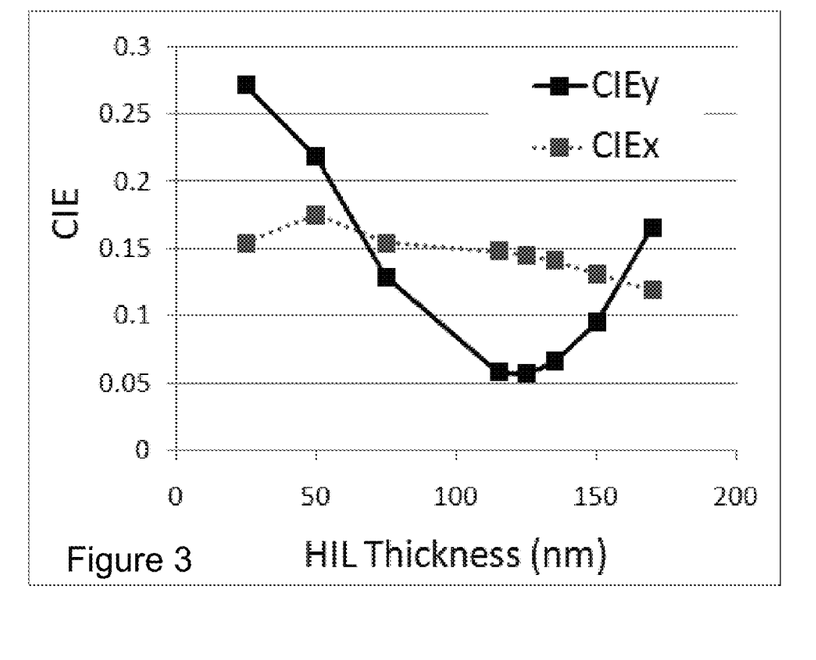
FIG. 3 shows a measured variation in OLED colour with hole injection layer (HIL) thickness.
Figure 4:
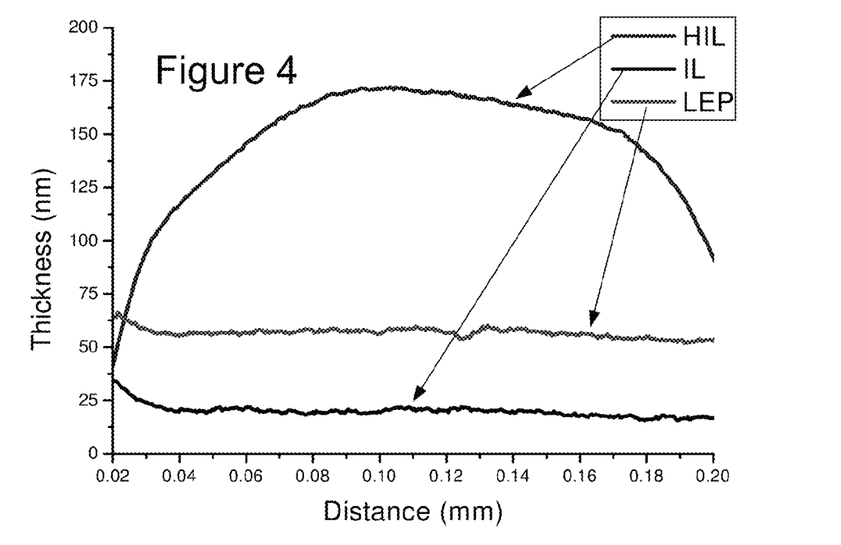
FIG. 4 shows variations in thicknesses of hole injection layer (HIL), interlayer (IL), and light emitting polymer (LEP) layer thicknesses across a pixel of a pixelated OLED display device.
Figure 5:
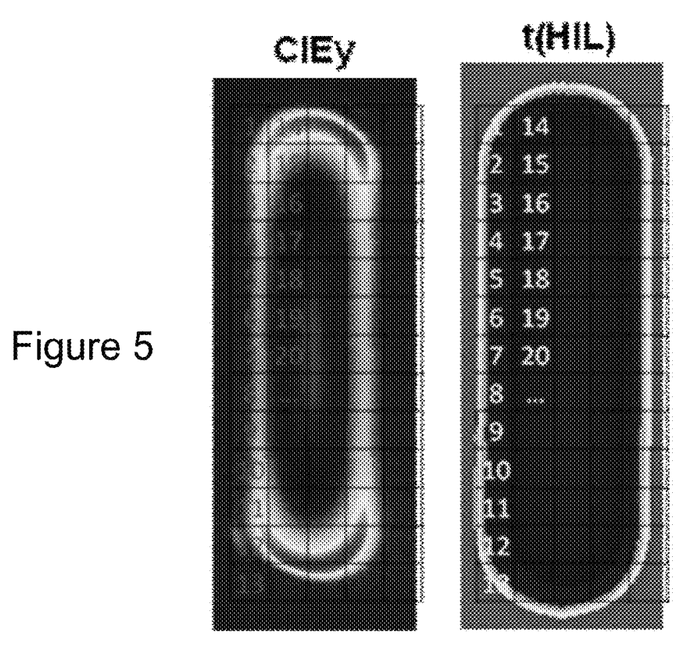
FIG. 5 shows spatial variation of the CIEy value across a pixel of an OLED display device (left) and corresponding variations in the thicknesses of the HIL layer (right)

The similarity between FIGS. 2 and 3 is encouraging but the results cannot readily be transferred to inkjet printed devices in which the layer thicknesses can vary significantly, for example by more than +/−100 nm. FIG. 4 shows measured thicknesses of HIL, IL and LEP layers of an inkjet printed OLED pixel with varying distance across the pixel, as measured by white light interferometry. It can be seen that in this example the IL and LEP thickness profiles are substantially flat whereas the HIL thickness profile varies by almost 150 nm. The precise profile of the thicknesses, especially the HIL thickness, is a complex function of, among other things, parameters of the solution deposition process such as material concentration, droplet size, and number of droplets, deposition time and so forth. FIG. 5 shows, on the right, a heat map of thicknesses of the HIL layer in a display pixel, illustrating the variation of HIL thickness in 3 dimensions. Once fabrication of the pixel is complete the output luminance and colour of the pixel is measured, spatially resolved over the area of the pixel, by employing a calibrated CCD (charge coupled device) camera with colour filters for tristimulus X, Y and Z values. This allows the CIE values to be determined, as described further below, and the left hand image in FIG. 5 shows CIEy, allowing the HIL profile to be matched to the corresponding output luminance and colour. FIG. 5 also illustrates meshing of the pixel area with, here, a square mesh with elements labelled 1-20 . . . . This facilitates linking the average HIL thickness in a square with the experimentally determined colour value, here CIEy, for the HIL thickness. Since, for the profile of FIG. 4, the IL and LEP layers are substantially flat, this provides a rapid technique for characterising the effect of varying HIL thickness within a target structure.

Figure 6:
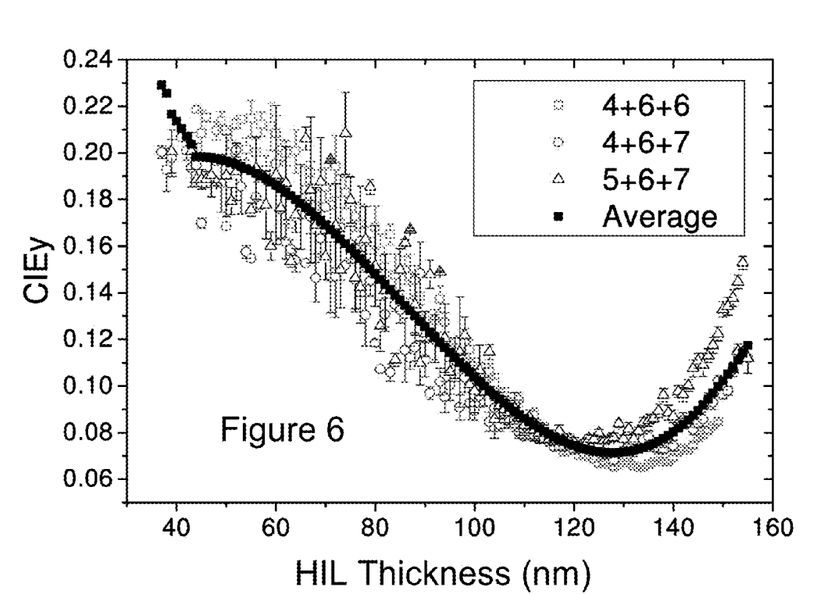
FIG. 6 shows a calibration curve of CIEy value against HIL thickness for a set of pixels of the type illustrated in FIG. 5, where different numbers of droplets of solution-deposited HIL material are used for different pixels of the set.

The characterisation data of FIGS. 4 and 5 enables a calibration curve of the type illustrated in FIG. 6 to be constructed. This shows (in this example) the CIEy value against HIL thickness for a range of different HIL thicknesses. To achieve a good range of thicknesses and conditions different droplet counts of inkjet printed HIL material in solution were employed, for example 4+6+6 droplets denoting 3 passes a first having 4 droplets along the length of a pixel and a second and third passes having 6 droplets along the length of a pixel.

The calibration curve of FIG. 6 shows the measured tristimulus values 'viewed' through a 'CIEy filter' but it will be appreciated that CIEx or CIEY may also be determined or a transformation into another colour space may be employed.

Once a calibration curve or curves of the type illustrated in FIG. 6 has been determined the 3D HIL profile of a proposed HIL formulation/process may be measured and the calibration curve used to predict the resulting light colour/intensity output. This can be done by meshing the area of a pixel, determining the average HIL thickness in each mesh area element and then summing the contributions from each mesh element to determine the overall light colour and/or intensity predicted to be produced from the pixel. This summing is preferably performed in the tristimulus colour space and then the summed tristimulus values may be converted to the target colour space, for example CIExyY colour space. The validity of this procedure can be demonstrated as follows, the equations below illustrating that tristimulus values from pixel area mesh elements can be summed linearly to produce an average tristimulus value for the area of a pixel:

From standard definitions:

$$X = \int_0^\infty I(\lambda)\bar{x}(\lambda)d\lambda$$

$$Y = \int_0^\infty I(\lambda)\bar{y}(\lambda)d\lambda$$

$$Z = \int_0^\infty I(\lambda)\bar{z}(\lambda)d\lambda$$

Now if we consider two sources with respective intensities $I_1$ and $I_2$ the total intensity is given by $I = I_1 + I_2$ and it can be seen that:

$$X = \int_0^\infty (I_1(\lambda) + I_2(\lambda))\bar{x}(\lambda)d\lambda$$

So we can re-write this as:

$$X = \int_0^\infty I_1(\lambda)\bar{x}(\lambda)d\lambda + \int_0^\infty I_2(\lambda)\bar{x}(\lambda)d\lambda$$

$$X = X_1 + X_2$$

$$x = \frac{X}{X+Y+Z} \quad y = \frac{Y}{X+Y+Z}$$

It will be appreciated that the tristimulus Y and Z values may similarly, validly be linearly summed. Thus to obtain average X, Y and Z values across the pixel the contributions from each point (mesh element) such as squares 1-20 of FIG. 5 are simply held together. Once this has been done the tristimulus values may be converted to the target colour space. for example to convert to CIE xyY the following conversions are employed (where CIEY is the same as the tristimulus Y value):

$$x = \frac{X}{X+Y+Z}$$

$$y = \frac{Y}{X+Y+Z}$$

Figure 7:
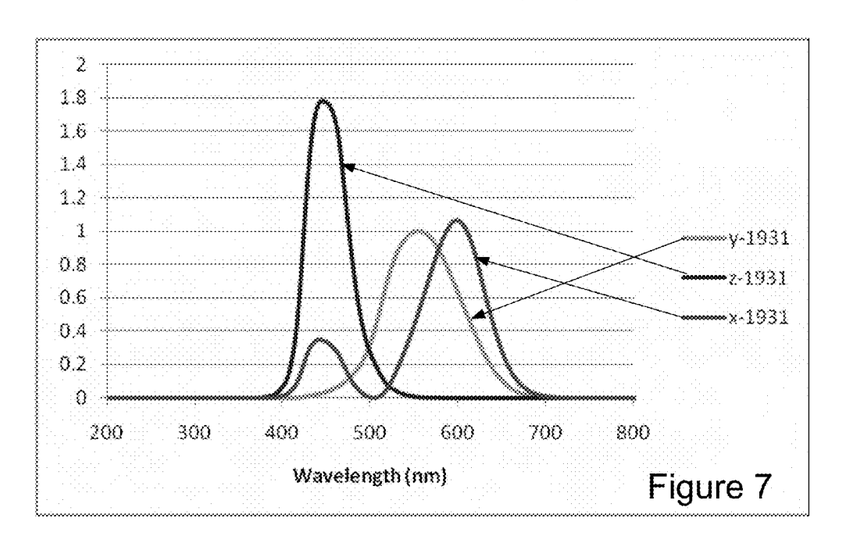
FIG. 7 illustrates a set of calibration curves for converting from X, Y, Z tristimulus values into 1931 CIE xyY colour space.

From the foregoing it will be appreciated that calibration curves along similar lines to FIG. 6 are needed for tristimulus X, Y and Z values. The spectral sensitivity curves of filters which may be employed to determine the CIE tristimulus values are illustrated in FIG. 7; in effect these define spectral sensitivity curves of (linear) light detectors which would yield the CIE tristimulus values X, Y and Z. The skilled person will appreciate that these may be mathematically applied to, for example, a CCD camera with a broad colour spectral response.

Figure 8:
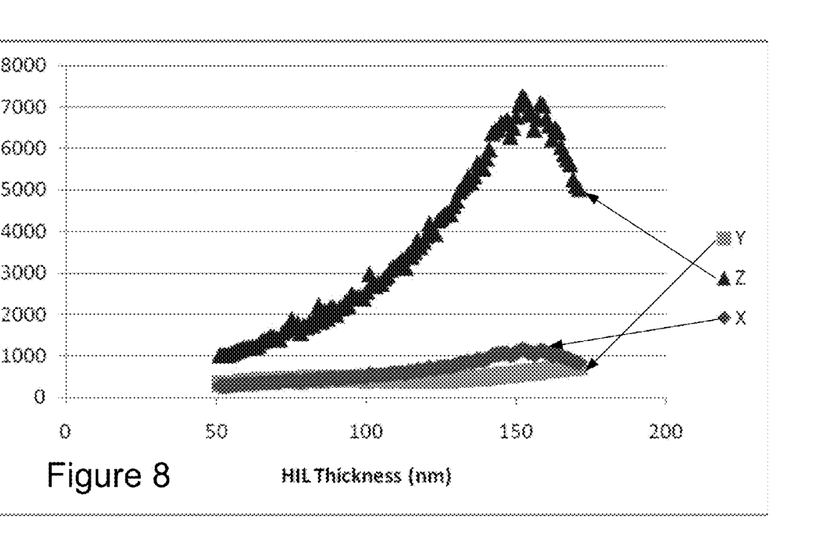
FIG. 8 illustrates calibration curves for a pixelated OLED display panel in tristimulus colour space.

FIG. 8 illustrates a set of 3 CIEX, Y and Z tristimulus calibration curves obtained for blue pixels of a pixelated OLED display panel; these approximately correspond to the CIEy calibration curve shown in FIG. 6.

From a set of curves of the type illustrated in FIG. 8, once the 3D HIL profile of an OLED pixel has been measured, the tristimulus values from points/regions across the pixel may be summed and then the result converted to CIExyY colour space using the above equations. This information may then be used to directly determine whether, were the device to be fabricated to completion, the colour would be within the tolerance range of a target, typically also specified as CIEx and CIEy values. It has been experimentally validated that an empirical approach of this type is sufficient to determine whether the output of a pixel is within a desired specification and this approach therefore greatly improves the rate at which HIL profiles/materials/processes may be screened.

Figures 9A, 9B:
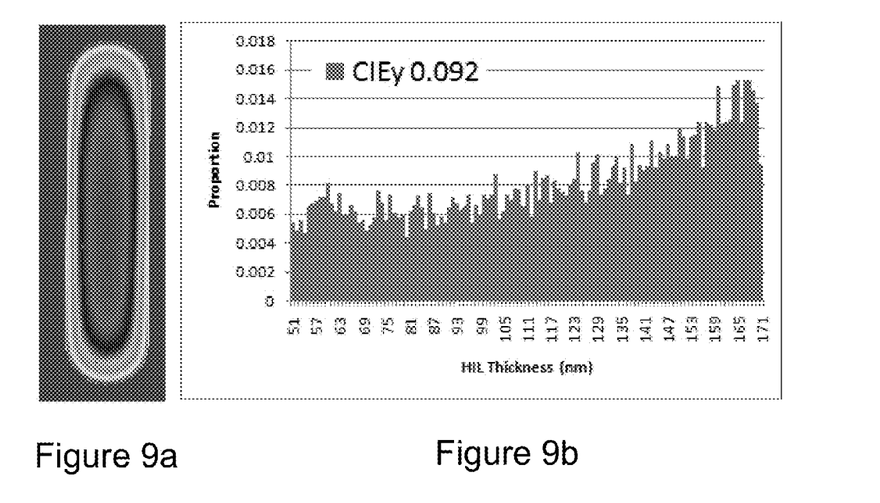
FIGS. 9a and 9b show, respectively, a map of a predicted CIEy value for a pixel of a production process OLED display panel made using the calibration data of FIG. 8; and the map of FIG. 9a expressed in the form of a frequency distribution histogram.

FIG. 9a shows a predicted heat map of a colour output of an OLED pixel, of a similar type to the experimentally measured colour illustrated in FIG. 5, and likewise showing a (predicted) CIEy level. This information may also helpfully be expressed in the form of a histogram as illustrated in FIG. 9b. This shows, on the Y-axis, a proportion of the total light output provided by a given HIL thickness, showing the HIL thickness on the X-axis (for a set of mesh elements, not shown in FIG. 9a). FIG. 9b illustrates that there can be a substantial variation in HIL thickness within the natural area of a pixel (a uniform thickness would appear as a delta function 'spike' in FIG. 9b). Nonetheless embodiments of the method we have described are able accurately to predict the colour output of the pixel and using these methods it is therefore not necessary to attempt to produce a device with a precisely uniform HIL (or other) layer thickness, which provides an additional advantage in a production process.

The skilled person will appreciate that the empirical model-based approach we have described may be employed to achieve a target colour and/or efficiency for a device by determining/defining one or more of: a mean HIL thickness, a median HIL thickness, a mode HIL thickness, a spread, for example standard deviation, of HIL thickness, an HIL profile or one or more parameters defining an HIL profile, and one or more HIL materials.

Although an illustrative example of the technique has been described with particular reference to the HIL layer, the skilled person will appreciate that the technique may correspondingly be applied to other layers of an OLED device depending on which, in a particular production process exhibit the greatest variation. In addition the technique may be applied to a combination of layers, for example to a combination of the HIL and HTL layers, which is appropriate because these have a similar refractive index.

Although a preferred embodiment of the technique has been described with particular reference to a pixel of a pixelated OLED display, it will similarly be recognised that the technique is not limited to such applications and may be applied in other situations where an OLED layer thickness may vary with lateral position across a device. For example when fabricating a large area device such as a lighting tile different deposition techniques may be employed, such as evaporation. In this case the HIL layer thickness may be substantially constant and the thickness of one or more other layers of the device, for example the HTL or LEP or LEP stack or an electrode may vary; the above described techniques may then be correspondingly employed to the one or more thickness-varying layers to similarly predict a colour and/or intensity to light output from the OLED device. In general the techniques may be employed to monitor/adjust the thickness of one or more organic layers deposited using a range of techniques including, but not limited to: spin coating, inkjet printing, silk screen printing, slot-die coating, gravure printing, flexographic printing and the like; in principle embodiments of the techniques may be employed for continuous monitoring of the predicted light output quality (for example colour/intensity) on a roll-to-roll production line process.

Broadly speaking we have described techniques for monitoring an OLED production process which may be employed either for an initial configuration of a process for example determining one or more layer thicknesses, or for checking/monitoring the process, for example to determine that device parameters are (predicted to be) within tolerance, or both. Techniques are particularly useful with pixelated, inkjet printed devices where complex effects can cause difficult to predict variations in light output. However the techniques are not limited to this application and may be employed generally to measure an organic layer thickness and in particular its profile/distribution and then to predict, at an early stage, the impact on the device to be fabricated in particular whether it will have the right colour or intensity. This may be employed for a pass/fail test and/or to modify the production process to correct for a predicted error, in particular by adjusting a thickness of one or more organic layers the device.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of monitoring an OLED production process for making an OLED device, the OLED device having a layered structure comprising an anode layer and a cathode layer, said anode and cathode layers sandwiching a hole injection layer, a hole transport layer and at least one organic light emitting layer, the method of monitoring comprising:
fabricating at least one reference OLED device similar to said OLED device, wherein said at least one reference OLED device has a layered structure corresponding to said OLED device and a range of hole injection and/or transport layer thicknesses;
characterizing a spectral variation of a light output of said at least one reference OLED device with respect to variation in said hole injection and/or transport layer thickness, wherein said characterization of said spectral variation of said light output comprises determining a set of tristimulus values for said light output;
partially fabricating a said OLED device, wherein said partial fabrication comprises depositing one or more layers comprising at least said hole injection and/or transport layer;
measuring a thickness of said one or more layers comprising at least said hole injection and/or transport layer;
predicting a light output for said partially fabricated OLED device, in a target color space, from said measuring, using said characterized spectral variation;
converting either said spectral characterization or said predicted light output from said tristimulus values, to said target color space; and
adjusting said thickness of said one or more layers comprising at least said hole injection and/or transport layer to adapt said light output to a target light output in said target color space.

2. The method as claimed in claim 1 further comprising making said OLED device with said adjusted thickness of said one or more layers comprising at least said hole injection and/or transport layer.

3. The method as claimed in claim 2 wherein said layered structure of said OLED device defines a resonant cavity, resonant at a wavelength of operation of said device.

4. The method as claimed in claim 1 wherein said target color space is CIE xyY color space.

5. The method as claimed in claim 1 further comprising measuring said thickness of said one or more layers comprising at least said hole injection and/or transport layer at a plurality of lateral locations on said partially fabricated OLED device, and predicting said light output by summing a predicted light output for each of said locations.

6. The method as claimed in claim 5 wherein said predicted light output is defined in terms of a set of tristimulus values for each of said locations, the method further comprising converting said summed light output for each of said locations into said target color space.

7. The method as claimed in claim 1 wherein said OLED device is a pixel of a pixilated OLED display, wherein said at least one reference OLED device comprises a said pixel, and wherein said range of hole injection and/or transport layer thicknesses comprises a range of thicknesses defined by a thickness variation over a lateral region of said pixel.

8. The method as claimed in claim 1 wherein said anode layer has a thickness of greater than 50 nm and wherein said hole injection layer has a thickness of less than 50 nm.

9. The method as claimed in claim 1 wherein said OLED device is a lighting tile and wherein said predicted light output comprises a variation in a color of light output from said lighting tile with lateral position on said tile.

10. The method as claimed in claim 1 wherein said hole injection and/or transport layer comprises a hole injection layer, and wherein said range of hole injection and/or transport layer thicknesses comprises a range of thicknesses of said hole injection layer.

11. The method as claimed in claim 1 wherein said hole injection and/or transport layer comprises a hole transport layer, and wherein said range of hole injection and/or transport layer thicknesses comprises a range of thicknesses of said hole transport layer.

12. A method of monitoring an OLED production process for making an OLED device, the OLED device having a layered structure comprising an anode layer and a cathode layer, said anode and cathode layers sandwiching a hole injection layer, a hole transport layer and at least one organic light emitting layer, the method comprising:
fabricating at least one reference OLED device similar to said OLED device, wherein said at least one reference OLED device has a layered structure corresponding to said OLED device and a range of thicknesses of at least one test layer of said OLED device;
characterizing a variation of light output from said at least one reference OLED device with respect to variation in said test layer thickness;
partially fabricating a said OLED device comprising depositing one or more layers comprising at least said test layer;
measuring a thickness of said one or more layers comprising at least said test layer at a plurality of lateral locations on said partially fabricated OLED device;
predicting a light output for said partially fabricated OLED device from said characterizing by summing a predicted light output for each of said locations; and
monitoring said process for making an OLED device using said predicted light output,
wherein said test layer comprises a layer of organic material.

13. The method as claimed in claim 12 wherein said characterizing of said variation of light output comprises characterizing a spectral variation of said light output, wherein said predicted light output is defined in terms of a set of tristimulus values for each of said locations, the method further comprising converting said summed light output for each of said locations into a target color space.

14. The method as claimed in claim 12 wherein said OLED device is a pixel of a pixelated OLED display, and wherein said range of test layer thicknesses comprises a range of thicknesses defined by a thickness variation of said test layer over a lateral region of said pixel.

15. The method as claimed in claim 12 wherein said OLED device is a lighting tile and wherein said predicted light output comprises a variation in said light output from said lighting tile with lateral position on said tile.

16. The method as claimed in claim 12 further comprising adjusting said thickness of said one or more layers comprising at least said test layer to adapt said light output to a target light output.

17. The method as claimed in claim 16 further comprising making said OLED device with said adjusted thickness of said one or more layers comprising at least said test layer.

18. The method of monitoring an OLED production process for an OLED device, the OLED device having a layered structure comprising an anode layer and a cathode layer, said anode and cathode layers sandwiching a hole injection layer, a hole transport layer and at least one organic light emitting layer, wherein said OLED device is a pixel of a pixelated OLED display, the method of monitoring comprising:

fabricating at least one reference OLED device similar to said OLED device, wherein said at least one reference OLED device comprises a said pixel and has a layered structure corresponding to said OLED device and a range of hole injection and/or transport layer thicknesses, wherein said range of hole injection and/or transport layer thicknesses comprises a range of thicknesses defined by a thickness variation over a lateral region of said pixel;

characterizing a spectral variation of a light output of said at least one reference OLED device with respect to variation in said hole injection and/or transport layer thickness;

partially fabricating a said OLED device, wherein said partial fabrication comprises depositing one or more layers comprising at least said hole injection and/or transport layer;

measuring a thickness of said one or more layers comprising at least said hole injection and/or transport layer;

predicting a light output for said partially fabricated OLED device, in a target color space, from said measuring, using said characterized spectral variation; and adjusting said thickness of said one or more layers comprising at least said hole injection and/or transport layer to adapt said light output to a target light output in said target color space.

* * * * *